United States Patent
Ozeki et al.

(10) Patent No.: US 6,317,242 B1
(45) Date of Patent: Nov. 13, 2001

(54) OPTICAL BUS SYSTEM AND SIGNAL PROCESSOR

(75) Inventors: Shinobu Ozeki; Tsutomu Hamada; Hiroki Ishida; Masaki Hirota; Kazuhiro Sakai; Kenichi Kobayashi; Masao Funada; Hiroshi Fujimagari, all of Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/221,994

(22) Filed: Dec. 29, 1998

(30) Foreign Application Priority Data

Jan. 9, 1998 (JP) .................................. 10-003122

(51) Int. Cl.$^7$ ........................ H04B 10/17; H04B 10/10; H04B 10/20
(52) U.S. Cl. .......................................... 359/163; 359/174
(58) Field of Search ...................... 359/163, 174

(56) References Cited

U.S. PATENT DOCUMENTS

| | | | | |
|---|---|---|---|---|
| 4,455,643 | * | 6/1984 | Smith et al. ........................... | 359/163 |
| 4,499,608 | * | 2/1985 | Broockman et al. ................ | 359/163 |
| 5,245,680 | * | 9/1993 | Sauter ................................... | 359/163 |
| 5,477,363 | * | 12/1995 | Matsuda ............................... | 359/117 |
| 5,479,288 | * | 12/1995 | Ishizuka et al. ..................... | 359/163 |
| 5,619,359 | * | 4/1997 | Redmond et al. ................... | 359/117 |
| 5,822,475 | * | 10/1998 | Hirota et al. ......................... | 385/24 |
| 5,926,303 | * | 7/1999 | Giebel et al. ........................ | 359/163 |
| 5,987,198 | * | 11/1999 | Hirota et al. ......................... | 385/24 |

FOREIGN PATENT DOCUMENTS

| | | | | |
|---|---|---|---|---|
| 4308321 | * | 9/1994 | (DE) ..................................... | 359/163 |
| A 64-14631 | | 1/1989 | (JP) . | |
| A 4-134415 | | 5/1992 | (JP) . | |
| B2 6-22351 | | 3/1994 | (JP) . | |
| B2 6-93051 | | 11/1994 | (JP) . | |
| A 8-328707 | | 12/1996 | (JP) . | |
| A 9-98137 | | 4/1997 | (JP) . | |
| 0028240 | * | 2/1986 | (JP) ..................................... | 359/163 |

OTHER PUBLICATIONS

T. Uchida et al., The 9$^{th}$ Science Lecture Meeting of Circuit Packaging Technology, 15C01, pp. 201–202, date unknown.
H. Tomimuro et al, "Packaging Technology for Optical Interconnections", IEEE, Tokyo, No. 33, 1994, pp. 81–86.
O. Wada, Electronics, Apr. Issue, 1993, pp. 52–55.

* cited by examiner

Primary Examiner—Leslie Pascal
(74) Attorney, Agent, or Firm—Oliff & Berridge, PLC.

(57) ABSTRACT

An optical bus system comprising an optical bus is furnished, along two opposed edges, with a plurality of signal light input/output portions for inputting and outputting signal light to and from the bus. Any one of the signal light input/output portions on one edge of the bus inputs signal light thereto and propagates the light to the opposite edge at which another signal light input/output portion outputs the propagated signal light from the bus. The system also comprises a plurality of light emitting/receiving circuits corresponding to the signal light input/output portions. Each light emitting/receiving circuit has a signal light sending unit and a signal light receiving unit. The signal light sending unit generates signal light and sends the generated signal light into the optical bus through the corresponding signal light input/output portion. The signal light receiving unit acquires a received light signal upon receipt of the signal light output by the corresponding signal light input/output portion. At least one of the light receiving/emitting circuits on each edge of the optical bus has a repeating or reflecting part that causes the corresponding signal light sending unit to send out the signal light received by the corresponding signal light receiving unit.

3 Claims, 5 Drawing Sheets

OPTICAL BUS SYSTEM AND SIGNAL PROCESSOR

BACKGROUND OF THE INVENTION

1. Field of the Invention

The present invention relates to an optical bus system and a signal processor, the optical bus system including an optical bus for transmitting signal light and a light transmitting/receiving circuit for transmitting and receiving signal light, the signal processor performing signal processing including signal light transmission.

2. Description of the Related Art

Along with the development of very large-scale integration (VLSI) circuits has come significantly enhanced functionality of daughter boards used by data processing systems. Because increased circuit functions entail a growing number of signal connections to a given daughter board, data bus boards (mother boards) that interconnect their daughter boards using bus arrangements have come to adopt parallel architectures involving numerous connectors and connection lines. More layers of ever-finer connection lines have been employed to promote parallelism in an attempt to boost the speed at which buses operate. With such architectures, however, system processing speeds are limited by the bus operating speed because of signal delays caused by the capacitance between connection lines and by their resistance. Another problem is the generation of heat by devices consuming more power than before. The monopolization of bus use entails prolonging standby time before signal transmission, which adversely affects system processing speeds. This has given rise to the need for simultaneous signal transmissions between a plurality of daughter boards. A further problem is the presence of electromagnetic interference (EMI) caused by densely arranged bus connection lines. EMI can be a big impediment to improving the speed of system processing.

Increased traffic of communication data has so far been addressed by installing more bus lines because there are limits to the bus operating speed. However, a larger number of bus lines necessitate higher power dissipation, give rise to lower transmission speeds associated with line skew, and take up more line space. Solutions to these disadvantages are proposed in Japanese Published Unexamined Patent Applications Nos. Sho 64-14631 and Hei 8-328707. The cited patent applications disclose analog bus connection schemes intended to reduce the number of lines between devices for easier line arrangements.

FIG. 5 is a schematic block diagram of a typical analog bus connection scheme disclosed in Japanese Published Unexamined Patent Application No. Hei 8-328707.

In FIG. 5, devices 501 and 511 are interconnected through an analog bus 506 that connects two A/D converters 504 and 507 as well as two D/A converters 505 and 508.

An n-bit signal from the device 501 travels over a transmission path 503 to enter the D/A converter 505 for conversion to analog data. The analog data signal is output onto the analog bus 506 to reach the A/D converter 507 for conversion to an n-bit digital signal. The digital signal is input to the device 511 over a transmission path 509. Conversely, a signal from the device 511 travels over a transmission path 510 to reach the D/A converter 508 for conversion to analog data. The analog data signal is output onto the analog bus 506 to reach the A/D converter 504 for conversion to a digital signal. The digital signal is then input to the device 501 over a transmission path 502.

As described above, the analog bus 506 in FIG. 5 functions with multi-level analog signals, while the devices 501 and 511 operate with digital signals.

In the conventional analog bus connection outlined above, the signals that travel over the analog bus 506 are multi-level analog signals. This means that components of bus line resistance and leak currents can cause signal level fluctuations. If bus lines are prolonged in the analog bus or if numerous devices are connected to the bus, it becomes difficult to transmit data correctly.

Many microcomputers require connecting a large number of function blocks using a plurality of buses. Because no communication is available between the multiple buses, it is difficult to implement the above type of analog bus connection scheme. In addressing such difficulties, Japanese Published Unexamined Patent Application No. Hei 8-328707 proposes a circuit to compensate for analog bus level fluctuations. However, the bus lines in the disclosed setup are electrical wires and are thus not fit completely to eliminate the level fluctuations caused by wiring resistance. There still exists the problem of growing power dissipation experienced when attempts are made to drive buses at high speeds, as well as the problem of line skew between parallel lines for mass data transmission. If bus lines are constituted by electrical wires, a multi-logic analog bus structure may be implemented to permit multiplex transmission unidirectionally, but not bidirectionally.

Studies have been made on how to utilize intra-system optical connection techniques called optical interconnection in high-speed signal transmission applications that cannot be implemented using electrical arrangements. Optical interconnection techniques that vary with the system configuration were outlined illustratively by Sadaji Uchida at the 9th Convention of Researchers on Circuit Packaging Technology in Japan (paper 15C0, pp. 201–202); by H. Tomimuro et al., in "Packaging Technology for Optical Interconnects" (IEEE Tokyo, No. 33, pp. 81–86, 1994); and by Osamu Wada in "Electronics" (the April 1993 issue, in Japanese, pp. 52–55).

Of the diverse optical interconnection techniques proposed so far, those disclosed in Japanese Published Unexamined Patent Application No. Hei 2-41042 apply an optical data transmission scheme involving high-speed, high-sensitivity light emitting/receiving devices to a data bus structure. The disclosed setup has the light emitting/receiving devices located on both sides of each of daughter boards installed in a system frame. In the space of the system frame, the light emitting/receiving devices on the contiguous daughter boards are optically connected to form a serial optical data bus for loop transmission between the daughter boards. The scheme works as follows: signal light from a given daughter board is converted to an electrical signal by an adjacent daughter board and then converted back by the same daughter board to signal light before being forwarded to another adjacent daughter board which repeats the same process, and so on. All serially arranged daughter boards in the system frame repeat optical-to-electrical and electrical-to-optical conversion successively for light signal transmission therethrough. The speed of signal transmission is thus dependent on and restricted by the speed of optical-to-electrical and electrical-to-optical signal conversion by the light emitting/receiving devices on each of the configured daughter boards. Because data transmission between adjacent daughter boards is effected through optical coupling in free space between the light emitting/receiving devices on the boards, these devices must be optically aligned and all daughter boards must be optically coupled. Optical coupling in free space can develop cross talk between contiguous optical transmission paths, thereby giving rise to possible data transmission defects. Faulty data transmission is also expected from signal light diffusion caused by ambient conditions (e.g., dust) in the system frame. Since the daughter boards are connected in series, removing any one of them will sever the connection at that point. Any daughter board, if removed, must be replaced by an additional board to preserve the connection. That is, the number of configured daughter boards is fixed and unchangeable.

Japanese Published Unexamined Patent Application No. Sho 61-196210 discloses techniques of data transmission between daughter boards using two-dimensional array devices. The techniques constitute a setup wherein plates with two parallel faces each are positioned opposite to a light source, the plate faces having diffraction grating and reflective elements making up optical paths which optically couple daughter boards bearing the plates. This scheme allows light from a single point to be connected only to one fixed point and, unlike electrical bus structures, does not permit comprehensive interconnection of all circuit boards. Because of the need for a complicated optical system and due to difficult alignment procedures, the disclosed setup may suffer misalignment between optical elements leading to cross talk between contiguous optical transmission paths, thereby causing possible data transmission defects. Because information about daughter board interconnection is determined by the diffraction grating and reflective elements arranged on the plate faces, the removal of any of the configured daughter boards will disrupt their interconnection. Hence there is little potential for expanded circuit board layout.

Japanese Published Unexamined Patent Application No. Hei 4-134415 discloses other techniques of data transmission between daughter boards using two-dimensional array devices. The techniques constitute a setup comprising a lens array and an optical system. The lens array is made of a substance with a refractive index higher than that of air, the substance having its surfaces equipped with a plurality of lenses with negative curvatures. The optical system is arranged to send light from a light source into a side of the lens array. Also disclosed is an alternative setup wherein the multiple lenses with negative curvatures are replaced by low refractive index regions and a hologram structure. In the setups above, the laterally entered light is output to the surfaces in a distributive manner through the multiple lenses or through the alternative low refractive index regions and hologram structure. Thus irregularities of intensity can occur in output light signals depending on positional relations between the light incident position on the one hand, and the locations of the multiple lenses or of the alternative low refractive index regions and hologram structure on the other hand. Furthermore, there is a need for arranging light input elements of the daughter boards where the multiple lenses with negative curvatures over the transparent substance are located or where the alternative low refractive index regions and hologram structure are positioned. This means that there is again little potential for expanded circuit board layout. These disadvantages may be circumvented by use of a sheet-like optical data bus which, proposed elsewhere, propagates diffused signal light. This type of bus, unlike the one disclosed in Japanese Published Unexamined Patent Application No. Hei 2-41042, does not require fixing the number of daughter boards, and eliminates those difficulties in optically aligning light emitting/receiving devices which are discussed in Japanese Published Unexamined Patent Application No. Sho 61-196210.

The above-described optical transmission schemes have all stopped short of going beyond the constraints of electronic circuits. This is because they still convert electronic signals to optical signals for transmission.

Japanese Published Unexamined Patent Application No. Hei 9-98137 discloses an example in which optical signals of different waveforms are transmitted bidirectionally over the same optical fiber.

In this case, although a single optical fiber structure is adopted, signal communication is available only between terminals each having a light emitter and a light receiving unit capable of sending and receiving light of a single waveform. To communicate freely between a large number of terminals requires furnishing them with a plurality of light emitters and receiving units dealing with different wavelengths of light. Such arrangements are complicated and bound to be costly.

In short, both electronic and optical circuits have so far failed to incorporate techniques allowing numerous terminals to communicate freely therebetween through the use of a reduced number of connection lines that may be installed easily.

SUMMARY OF THE INVENTION

It is therefore an object of the present invention to overcome the above and other deficiencies and disadvantages of the prior art and to provide an optical bus system that ensures free communication between a plurality of terminals (devices, circuit boards, etc.), and a signal processor using that optical bus system.

In carrying out the invention and according to one aspect thereof, there is provided a first optical bus system comprising: an optical bus system, comprising: an optical bus having a plurality of signal light input/output portions disposed along two opposed edges of said optical bus to input and output signal light, wherein the signal light input from said signal light input/output portions disposed at one of said edges thereof is transmitted toward the other edge thereof and is output from said signal light input/output portions disposed at the other edge thereof; and a plurality of light emitting/receiving circuits provided corresponding to said plurality of signal light input/output portions, wherein each of the light emitting/receiving circuit has a signal light emitting unit which generates the signal light entered into said optical bus through the corresponding signal light input/output portion and a signal light receiving unit which receives the signal light output from the corresponding signal light input/output portion to obtain a signal corresponding to the input signal at least one of the light receiving/emitting circuits corresponding to the plurality of signal light input/output portions on each of the two edges of the optical bus includes a repeater that causes the corresponding signal light sending unit to send out the signal light received by the corresponding signal light receiving unit.

In this optical bus system, at least one of said light receiving/emitting circuits disposed at each of said two edges of said optical bus includes a repeater which send out the same signal light received by the corresponding signal light receiving unit to the optical bus through the corresponding signal light input/output portion.

According to another aspect of the invention, there is provided a second optical bus system comprising: an optical bus system further comprises a reflector which is disposed at each of said two edges of said optical bus, wherein the reflector reflects the signal light propagated through said optical bus toward the opposite edge.

According to a further aspect of the invention, there is provided a first signal processor comprising: a substrate; a plurality of circuit boards each including a signal light input/output edge through which signal light is input and output, a signal generating circuit for generating a signal to be carried by signal light output from said signal light input/output edge, and a signal processing circuit for processing the signal carried by the signal light input through said signal light input/output edge; an optical bus attached to said substrate and having a plurality of signal light input/output portions through which the signal light into or from the signal light input/output edge passes, wherein the signal light input from said signal light input/output portions at one of said edges is transmitted toward the other edge thereof and is output from said signal light input/output portions disposed at the other edge thereof; and a circuit board fixing part which fixes said circuit boards to said substrate In this signal processor, at least one of said plurality of circuit boards on each of said two edges of said optical bus includes a repeater which send out the same signal light received at the corresponding signal light input/output edge to the optical bus through the corresponding signal light input/output portion.

According to an even further aspect of the invention, there is provided a second signal processor further comprises a each of the two edges of the optical bus has a reflecting part that reflects toward the opposite edge the signal light propagated through the optical bus to one edge thereof.

Other objects, features and advantages of the invention will become more apparent upon a reading of the following description and appended drawings.

DESCRIPTION OF THE PREFERRED EMBODIMENTS

Preferred embodiments of this invention will now be described with reference to the accompanying drawings.

Figure 1:
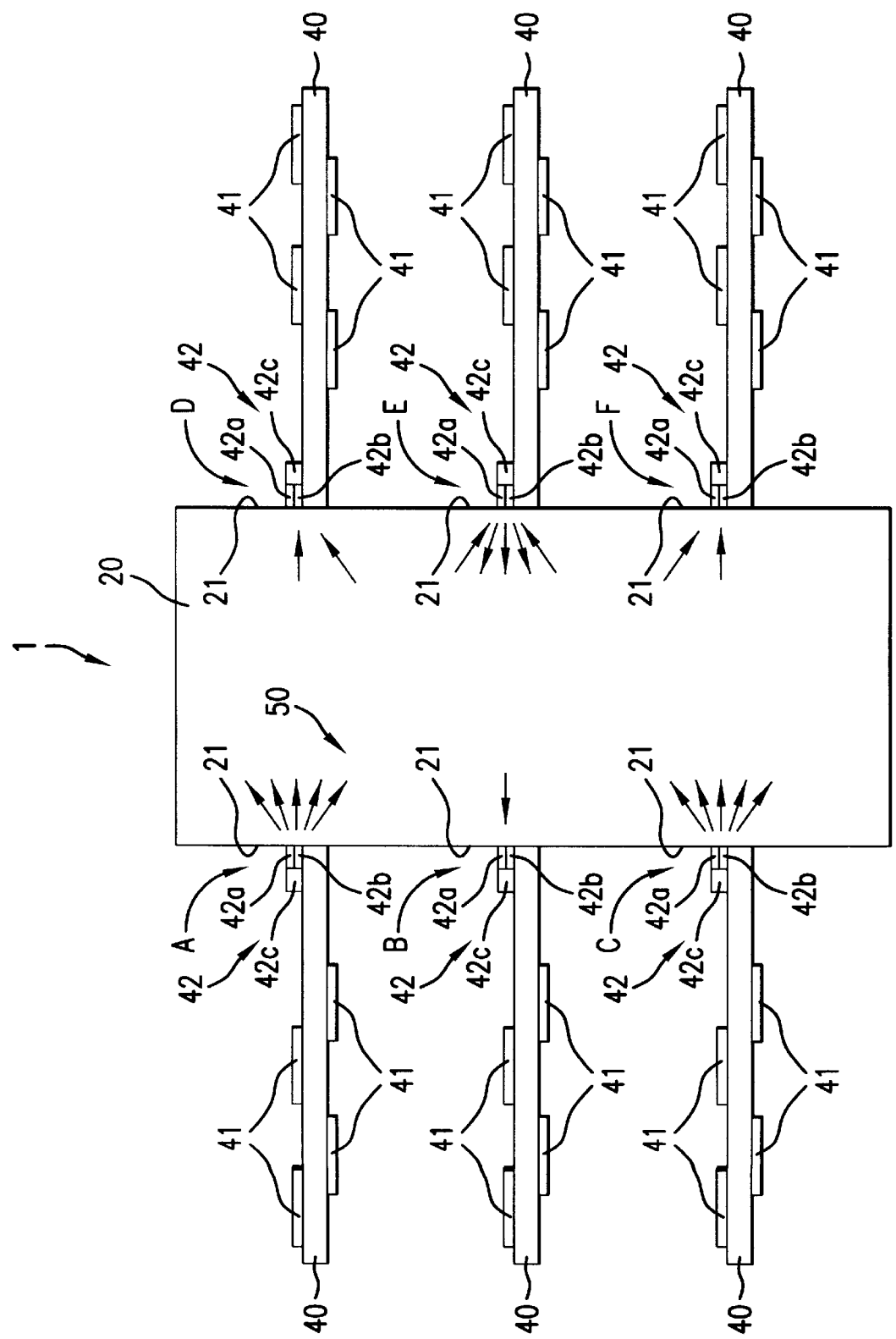
FIG. 1 is a schematic view of an optical bus system practiced as a first embodiment of this invention.

FIG. 1 is a schematic view of an optical bus system practiced as the first embodiment of this invention. The optical bus system in FIG. 1 comprises a rectangular sheet type optical bus 20, and daughter boards 40 each equipped with electronic circuits 41 and a light emitting/receiving circuit 42.

The optical bus 20 has a plurality of signal light input/output portions 21 (six units in FIG. 1) located along two edges of the bus 20 for signal light input and output. Signal light input from the signal light input/output portions 21 disposed at one of the edges thereof is transmitted to the other edge thereof and is output from the signal light input/output portions 21 disposed at the other edge thereof.

The light emitting/receiving circuits 42 are provided corresponding to the signal light input/output portions 21. Each light emitting/receiving circuit 42 includes a signal light sending unit 42a and a signal light receiving unit 42b. The signal light sending unit 42a generates signal light 50 and sends the generated signal light 50 into the optical bus 20 through the corresponding signal light input/output portion 21. The signal light receiving unit 42b acquires a received light signal upon receipt of the signal light 50 output by the corresponding signal light input/output portion 21. Each light receiving/emitting circuit 42 includes a repeater 42c that causes the corresponding signal light sending unit 42a to send out the signal light received by the corresponding signal light receiving unit 42b. FIG. 1 shows nodes A, B, C, D, E and F corresponding to the configured signal light input/output portions 21. In this setup, the nodes A and C serve as light input nodes through which an externally entered electrical signal is converted to light and input to the optical bus 20. The nodes B, D and F act as light output nodes through which signal light propagated in the optical bus 20 is received and converted back to an electrical signal for output from the bus 20. The node E operates as a repeat node that receives propagated light and sends out the received light for retransmission. Where a sheet type optical bus is to be furnished with a plurality of nodes, any increases in the number of nodes require narrowing node-to-node spacing (packaging density) along the bus. If the sheet is rectangular in shape, the same edge must have both input and output nodes. However, it is difficult to transmit signal light from an input node directly to an output node on the same edge. With this optical bus system 1, each light receiving/emitting circuit 42 has the repeater 42c that receives signal light from the opposite edge of the bus 20 and sends the received light back toward the opposite edge. The repeater 42c allows an input node to transmit signal light to an output node along the same edge of the bus 29, as will be described later. Since there is no need for a plurality of repeaters 42c to repeat signal light simultaneously, each of the repeaters 42c is set to be activated or deactivated beforehand by the corresponding electronic circuits 41 for signal light retransmission. Of the three nodes D, E and F along one bus edge in this setup, only the node E has its repeater 42c activated in advance. Along the opposite bus edge, any one of the three nodes A, B and C may have its repeater 42c preset to be activated. In the case where the nodes D, E and F are connected to memories and that the nodes A and C are connected to CPUs, any one of the nodes D, E and F, when not used by the corresponding memory, may have its repeater 42c activated; it is not mandatory to preset activation or deactivation of the repeater 42c of each of the nodes D, E and F. If the CPUs gain access from the nodes A and C to memories through the node D and E and if the memory connected to the node F is not accessed, then the repeater 42c of the node F may be activated. This will enhance the efficiency of memory access performance.

Signal light 50 input through the nodes A and C propagates through the sheet type bus 20 to the opposite edge of the bus while diffusing therethrough. Arriving at the nodes D and F, the signal light 50 is received by the signal light receiving units 42b of the nodes D and F for conversion to an electrical signal. The signal light having reached the node E is received by the signal light receiving unit 42b of that node and sent out in the opposite direction by the signal light sending unit 42a via the repeater 42c. Sending out the signal light 50 "in the opposite direction" does not signify retransmitting the received light in the exactly opposite direction in geometrical terms; rather it means that the repeated signal light proceeds as it diffuses in approximately opposite directions, as illustrated in FIG. 1. The signal light 50 repeated by the repeater 42c again passes through the optical bus 20 to reach the node B. Given the incoming light 50, the signal light receiving unit 42b of the node B converts the light to an electrical signal. As described, the presence of the repeater 42c makes it possible to communicate the signal light 50 between adjacent nodes A and B or between the adjacent nodes B and C, i.e., between nodes furnished on the same edge of the optical bus. In other words, the optical bus system 1 as the first embodiment has numerous terminals (devices, daughter boards, etc.) connected to both edges of the bus so that these terminals may communicate freely therebetween. Although the optical bus system 1 was shown comprising a rectangular sheet type optical bus 20, this is not limitative of the invention. The optical bus 20 may alternatively be a disk type bus. The optical bus system 1 of the first embodiment was shown having all light emitting/receiving circuits equipped with repeaters. Alternatively, on each edge of the optical bus 20, at least one of the light emitting/receiving circuits need only include a repeater. The node provided with that repeater keeps receiving and forwarding propagated signal light for retransmission to downstream circuits while sending out a reflected signal through the corresponding signal light sending unit at the same time.

Benefits of optical transmission such as noninterference of light and its additivity may be utilized further to expand the scope of usage for the sheet type optical bus, as will be described below with reference to FIG. 2.

Figure 2:
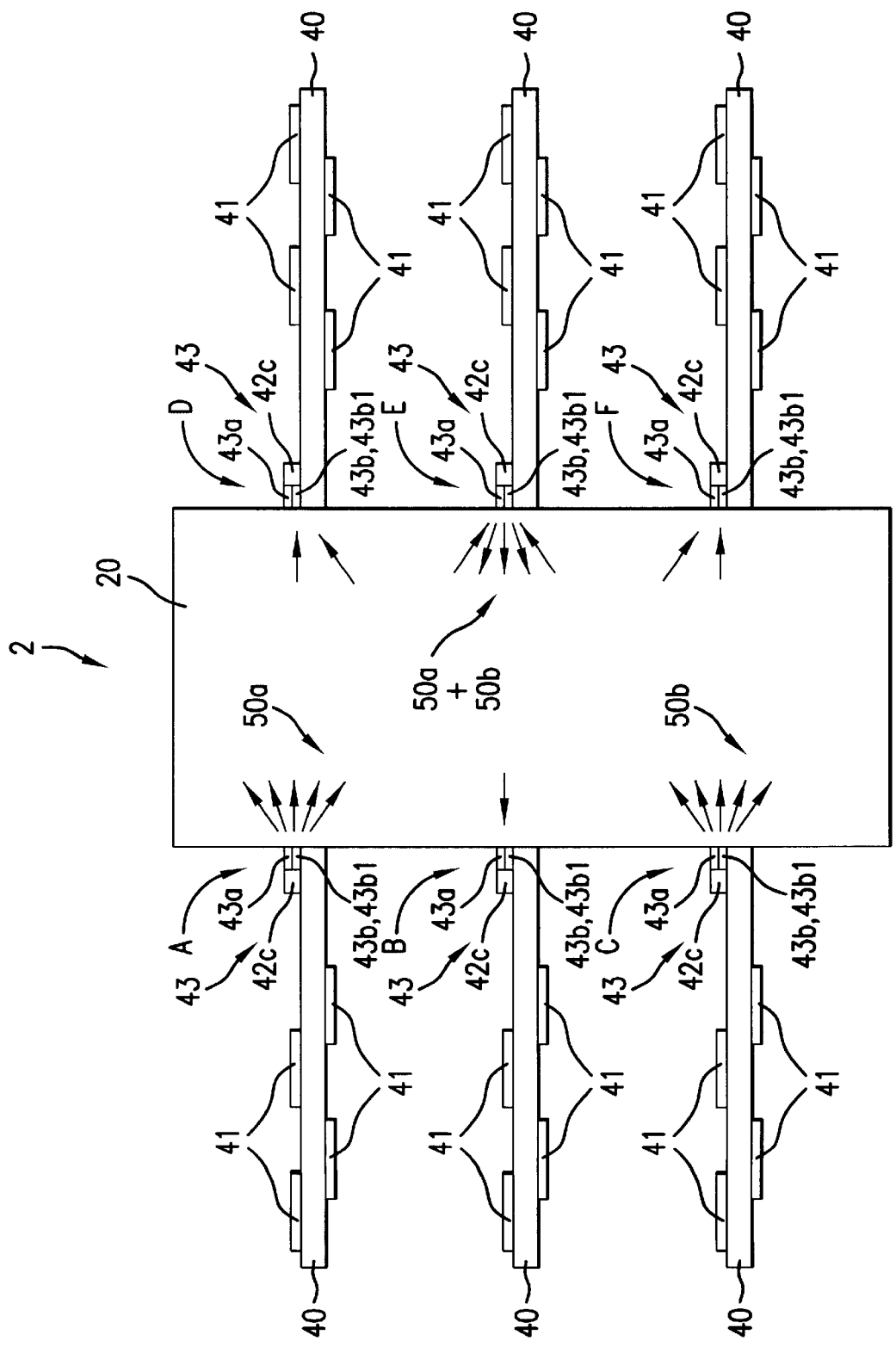
FIG. 2 is a schematic view of an optical bus system practiced as a second embodiment of this invention.

FIG. 2 is a schematic view of an optical bus system practiced as the second embodiment of this invention.

In describing the second embodiment, those parts that are substantially the same in function as those already described in connection with the first embodiment of FIG. 1 will be designated by the same reference numerals, and their descriptions will be omitted where they are repetitive.

Light emitting/receiving circuits 43 making up the optical bus system 2 in FIG. 2 comprise signal light sending units 43a that simultaneously generate pulse train signal light at mutually different light intensity levels. The light emitting/receiving circuits 43 also include signal light receiving units 43b each acquiring a received light signal upon receipt of signal light. Each of the signal light receiving units has 43b a signal separating unit 43b1 that separates, from a plurality of signal components of signal light generated simultaneously by a plurality of light emitting/receiving circuits 43, the signal component corresponding to the signal light generated by a specific light emitting/receiving circuit 43. Each of the light emitting/receiving circuits 43 further comprise the above-described repeater 42c.

In the nodes A and C, the signal light sending units 43a of the light emitting/receiving circuits 43 simultaneously generate pulse train signal light components 50a and 50b at mutually different light intensity levels. Being light in nature, the generated signal light components 50a and 50b do not interfere with each other so that their simple sum reaches the nodes D, E and F. In the repeat node E, the repeater 42c of the light emitting/receiving circuit 43 sends back the received signal light components 50a and 50b in the opposite direction. The signal light components 50a and 50b thus repeated reach the node B. In the node B, the light emitting/receiving circuit 43 gets the signal separating unit 43b1 of its signal light receiving unit 43b to separate from the received light the signal component corresponding to the signal light generated by a specific light emitting/receiving circuit 43. In the case where in the optical bus system 2 as the second embodiment, the nodes A and C are connected to CPUs and that the nodes B, D and E are connected to a shared memory, the two CPUs may each access the shared memory independently because the above-described separating unit 43b1 is provided. That signifies specifically that signals may be simultaneously transmitted bidirectionally between the nodes A and D as well as between the nodes C and B, and unidirectionally between the nodes A and D as well as between the nodes C and E.

The optical bus system 2 as the second embodiment for multiplex signal light transmission was shown with an example of simultaneously sending pulse train signal light at mutually different light intensity levels. However, this is not limitative of the invention, and signal light may be transmitted at different wavelength levels. The repeater may include a circuit for separating multiplexed signal light components to generate repeat signal in a more assertive manner. For example, if two kinds of signal light are received, only one of them may be forwarded selectively. If the sole signal component to be repeated is converted to a different kind of light signal before being sent out, a more complex optical transmission scheme may be implemented. Illustratively, each node may receive a signal light component and, on recognizing it to have been repeated by another node, may send out a different kind of signal light. The light emitting/receiving circuit 43 may perform such signal recognition by means of its signal light receiving unit 43b. If the repeater 42c is equipped with a buffer memory to stagger transmissions of the same type of signal light over time, it is possible for each of the light emitting/receiving circuits 43 to receive signal light independently.

Figure 3:
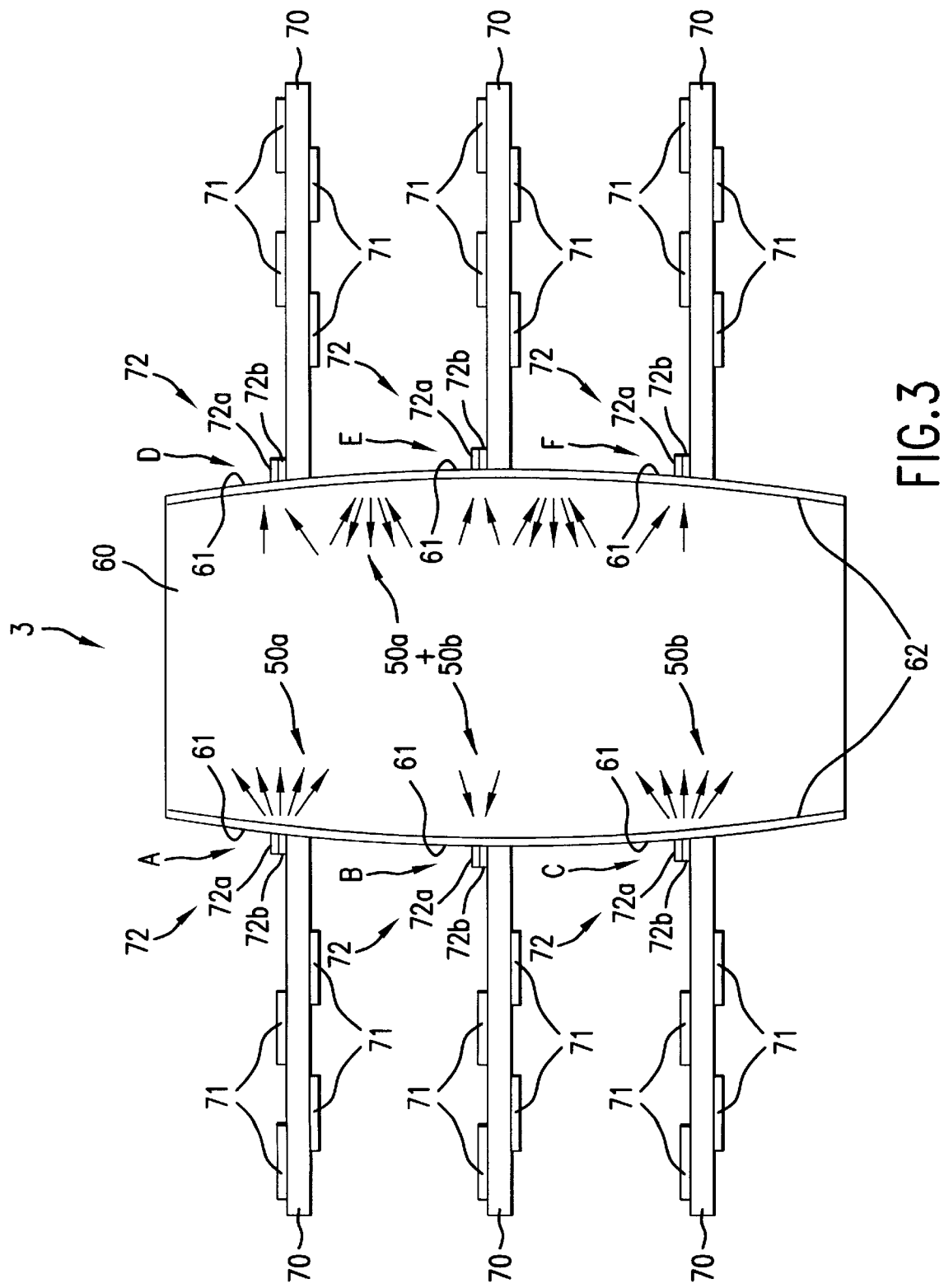
FIG. 3 is a schematic view of an optical bus system practiced as a third embodiment of this invention.

FIG. 3 is a schematic view of an optical bus system practiced as the third embodiment of this invention.

The optical bus system 3 in FIG. 3 comprises a rectangular sheet type optical bus 60, and daughter boards 70 each equipped with electronic circuits 71 and a light emitting/receiving circuit 72.

The optical bus 60 has a plurality of signal light input/output portions 61 (six units in FIG. 3) located along two edges of the bus 60 for signal light input and output. Each of the two edges of the optical bus 60 has a reflecting layer 62 (typically embodying the reflecting part of this invention) for reflecting toward the opposite edge the signal light propagated from a signal light sending unit 72a (to be described later) through the bus 60 to one edge thereof. Those portions of the reflecting layer 62 which cover the nodes A, B, C, D, E and F are made of a substance of high transmittance because the nodes are to carry out light signal input and output. Those portions of the reflecting layer 62 which do not cover the nodes A through F may be constituted by any substance—organic or inorganic material or a metal film—as long as it ensures high reflectance. The edges of the optical bus 60 are each formed in a concave fashion so as to converge light.

The light emitting/receiving circuits 72 are provided corresponding to the signal light input/output portions 61. Each light emitting/receiving circuit 72 includes a signal light sending unit 72a and a signal light receiving unit 72b. The signal light sending unit 72a generates signal light and sends the generated signal light into the optical bus 60 through the corresponding signal light input/output portion 61. The signal light receiving unit 72b acquires a received light signal upon receipt of the signal light output by the corresponding signal light input/output portion 61. The signal light sending units 72a are capable of simultaneously generating pulse train signal light at mutually different light intensity levels.

In the light input nodes A and C of the above-described optical bus system 3, the signal light sending units 72a of the light emitting/receiving circuits 72 simultaneously generate pulse train signal light components 50a and 50b at mutually different light intensity levels. The signal light components 50a and 50b thus generated propagate through the optical bus 60 to reach the light output nodes D, E and F. The light components 50a and 50b are reflected simultaneously by the reflecting layer 61 within the sheet type bus to travel in the opposite direction, eventually reaching the node B for light output. Since the optical bus 60 has concave-shaped edges for converging light, any drop in light intensity resulting from the double diffusion of the signal light components 50a and 50b inside the bus is minimized; the components 50a and 50b are converged efficiently onto the output node B. In this manner, signal light is sent out from one bus edge to the other and back while a sufficiently high intensity level is maintained.

Figure 4:
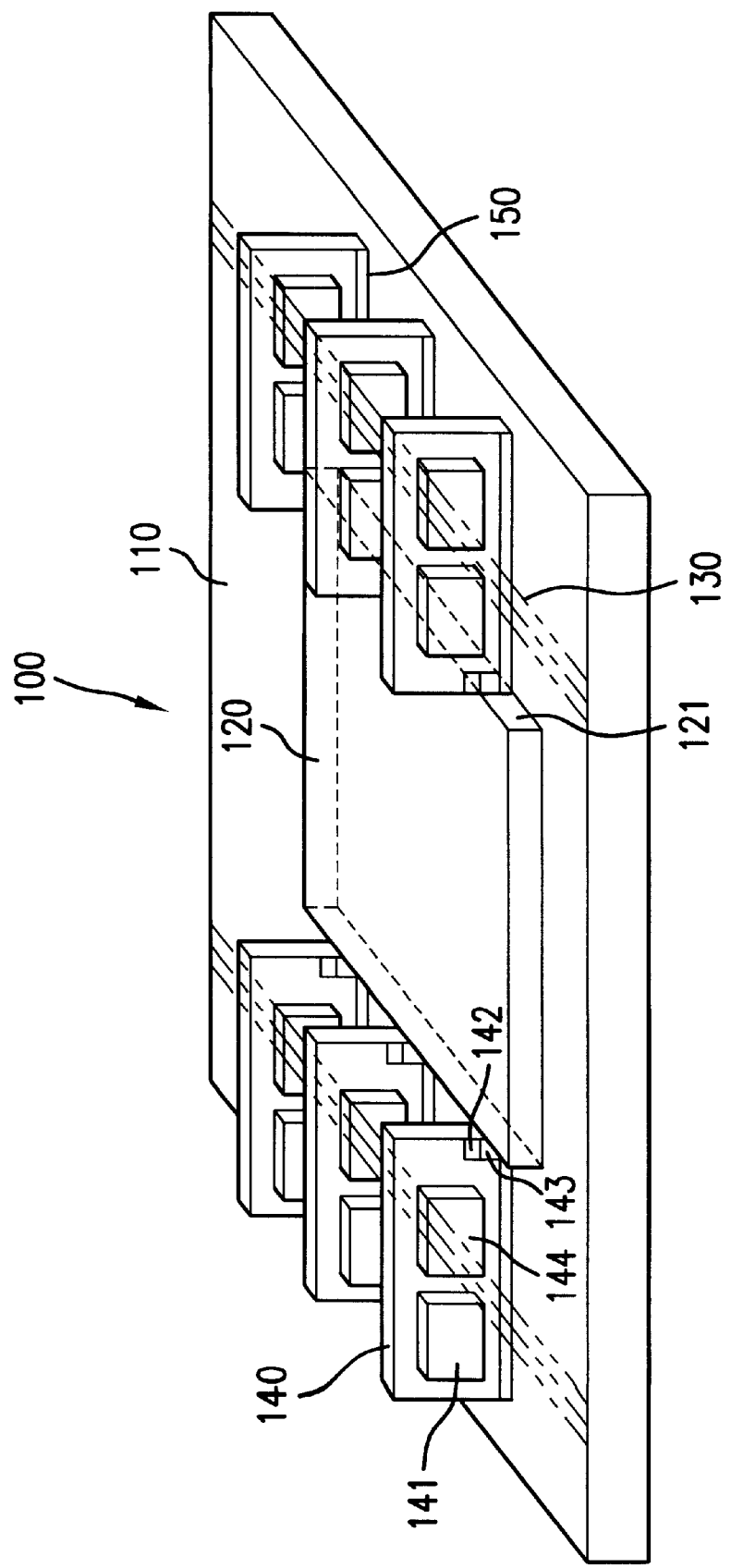
FIG. 4 is a schematic view of a signal processor practiced as an embodiment of this invention.
Figure 5:
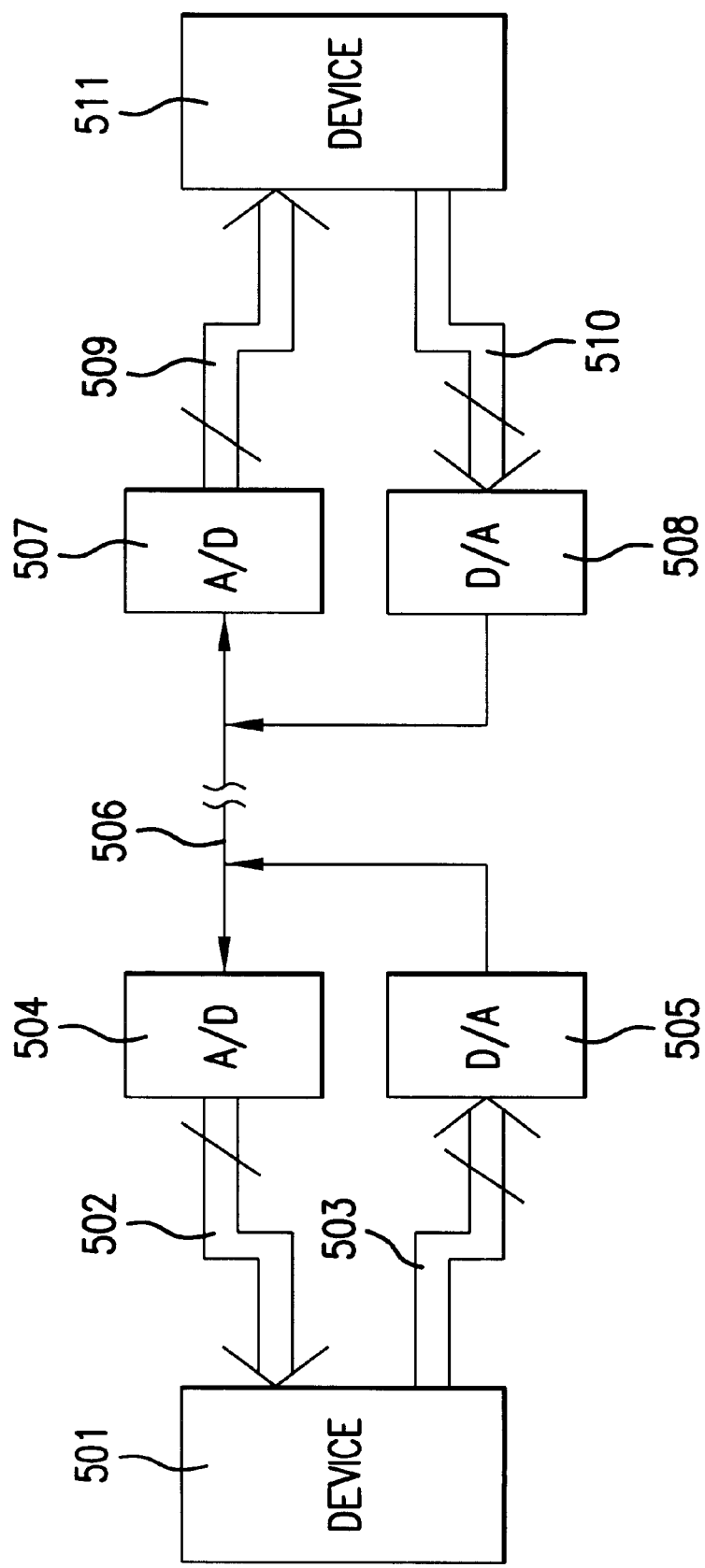
FIG. 5 is a schematic block diagram of a typical analog bus connection scheme disclosed in Japanese Published Unexamined Patent Application No. Hei 8-328707.

FIG. 4 is a schematic view of a signal processor 100 practiced as the fourth embodiment of this invention.

The signal processor 100 includes a substrate 110, an optical bus 120 fixed onto the substrate 110, lines 130 furnished on the substrate 110 for electrical signal transmission, a plurality of daughter boards 140, and connectors 150 which are fastened to the substrate 110 to secure the daughter boards 140 removably thereon and which connect the lines 130 on the substrate 110 to lines (not shown) on the daughter boards 140.

Each daughter board 140 comprises electronic circuits 141, a signal light input/output edge 142 for signal light input and output, and a signal generating/processing circuit 143. The signal generating/processing circuit 143 is made up of two circuits: one for generating a signal to be carried by the signal light output by the corresponding signal light input/output edge 142, and another for processing the signal carried by the signal light input from the signal light input/output edge 142. Of the plurality of daughter boards 140, at least one has a repeater 144 on each edge of the optical bus 120. The repeater 144 receives signal light via the corresponding signal light input/output edge 142 and sends out the received light through the same signal input/output edge 142.

The optical bus 120 is furnished, along its two edges, with a plurality of signal light input/output portions 121 for signal light input and output. Signal light that is input through a signal light input/output portion 121 on one bus edge is propagated to the other edge at which another signal light input/output portion 121 outputs the propagated signal light from the optical bus 120.

When a signal light input/output edge 142 inputs signal light to a signal light input/output portion 121 on one edge of the optical bus 120, the entered signal light propagates towards the opposite edge of the bus 120 while diffusing in a sheet. The repeater 144 in a daughter board 140 on the opposite bus edge captures the transmitted signal light and sends out the light through the corresponding signal light input/output edge 142. In this manner, signal light communication takes place between nodes located on the same edge of the optical bus 120, whereby communication between the multiple daughter boards 140 is freely implemented.

The repeaters 144 of the signal processor 100 for repeating signal light through the bus interior may be replaced illustratively by reflecting elements. That is, on each edge of the optical bus 120, a reflecting element may be provided to reflect toward the opposite edge the signal light that was input to the bus and propagated therethrough. This also permits signal light communication between nodes positioned on the same edge of the optical bus 120.

As described, the optical bus system of the invention for signal transmission using directional light comprises elements for sending out in the opposite direction the signal light that was input from one edge of a sheet type optical bus and propagated therethrough. The scheme allows signal light to be transmitted in any direction within the optical bus. Where such optical transmission characteristics as noninterference of light and its additivity are utilized, the inventive optical bus system provides high-speed optical transmission of data and information in large quantities.

While preferred embodiments of the invention have been described using specific terms, such description is for illustrative purposes only, and it is to be understood that changes and variations may be made without departing from the spirit or scope of the claims that follow.

What is claimed is:

1. An optical bus system, comprising:
  an optical bus having a plurality of signal light input/output portions disposed along two opposed edges of said optical bus to input and output signal light, wherein the signal light input from said signal light input/output portions disposed at one of said edges thereof is transmitted toward the other edge thereof and is output from said signal light input/output portions disposed at the other edge thereof; and
  a plurality of light emitting/receiving circuits provided corresponding to said plurality of signal light input/output portions, wherein each of the light emitting/receiving circuit has a signal light emitting unit which generates the signal light entered into said optical bus through the corresponding signal light input/output portion and a signal light receiving unit which receives the signal light output from the corresponding signal light input/output portion to obtain a signal corresponding to the input signal,
  wherein at least one of said light receiving/emitting circuits disposed at each of said two edges of said optical bus includes a repeater which send out the same signal light received by the corresponding signal light receiving unit to the optical bus through the corresponding signal light input/output portion.

2. An optical bus system according to claim 1, wherein each of said signal light sending units corresponding to the signal light input/output portions which activates simultaneously generates the signal light having mutually different intensity, and wherein each of said signal light receiving units has a signal separating unit that separates the signal component of the corresponding light emitting/receiving circuit from a multiplex light signal caused by the simultaneous signal light output by the plurality of light emitting/receiving circuits.

3. A signal processor comprising:
  a substrate;
  a plurality of circuit boards each including a signal light input/output edge through which signal light is input and output, a signal generating circuit for generating a signal to be carried by signal light output from said signal light input/output edge, and a signal processing circuit for processing the signal carried by the signal light input through said signal light input/output edge;
  an optical bus attached to said substrate and having a plurality of signal light input/output portions through which the signal light into or from the signal light input/output edge passes, wherein the signal light input from said signal light input/output portions at one of said edges is transmitted toward the other edge thereof and is output from said signal light input/output portions disposed at the other edge thereof; and a circuit board fixing part which fixes said circuit boards to said substrate;

wherein at least one of said plurality of circuit boards on each of said two edges of said optical bus includes a repeater which send out the same signal light received at the corresponding signal light input/output edge to the optical bus through the corresponding signal light input/output portion.

* * * * *